United States Patent
Mag et al.

(10) Patent No.: US 9,333,706 B2
(45) Date of Patent: May 10, 2016

(54) PULL TAB DESIGN FOR STRETCH RELEASE ADHESIVE

(71) Applicant: Apple Inc., Cupertino, CA (US)

(72) Inventors: Stefan C. Mag, San Francisco, CA (US);
Matthew D. Hill, Santa Clara, CA (US);
Scott A. Myers, Saratoga, CA (US);
Liane J. Fang, Los Altos, CA (US);
Tyler B. Cater, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 76 days.

(21) Appl. No.: 14/254,809

(22) Filed: Apr. 16, 2014

(65) Prior Publication Data

US 2015/0064386 A1    Mar. 5, 2015

Related U.S. Application Data

(60) Provisional application No. 61/873,765, filed on Sep. 4, 2013.

(51) Int. Cl.
| | |
|---|---|
| *C09J 7/02* | (2006.01) |
| *B29C 65/50* | (2006.01) |
| *B29C 65/76* | (2006.01) |
| *C09J 7/00* | (2006.01) |
| *H04M 1/02* | (2006.01) |
| *F16B 11/00* | (2006.01) |

(52) U.S. Cl.
CPC . *B29C 65/50* (2013.01); *C09J 7/00* (2013.01); *H04M 1/026* (2013.01); *C09J 2201/618* (2013.01); *C09J 2203/33* (2013.01); *F16B 11/006* (2013.01); *H04M 1/0262* (2013.01); *Y10T 428/1476* (2015.01); *Y10T 428/2419* (2015.01); *Y10T 428/24273* (2015.01); *Y10T 428/24777* (2015.01)

(58) Field of Classification Search
CPC ......... B29C 65/50; B29C 65/76; F16B 11/00; G06F 1/00; C09J 7/00; C09J 7/02; C09J 2201/618; C09J 2201/128; C09J 2203/33; H04M 1/026; H04M 1/0262; Y10T 428/24777; Y10T 428/14; Y10T 428/1476; Y10T 428/2419; Y10T 428/28; Y10T 428/24273

See application file for complete search history.

(56) References Cited

U.S. PATENT DOCUMENTS

| | | | | |
|---|---|---|---|---|
| 5,984,247 | A * | 11/1999 | Luhmann ............... | A47G 1/175 248/205.3 |
| 6,641,910 | B1 * | 11/2003 | Bries ..................... | C09J 7/02 248/205.3 |
| 6,680,096 | B1 * | 1/2004 | Luhmann ............... | C09J 7/00 428/192 |
| 2009/0229732 | A1 * | 9/2009 | Determan .............. | B32B 7/12 156/60 |
| 2011/0223447 | A1 | 9/2011 | Ignor et al. | |
| 2014/0045010 | A1 | 2/2014 | Myers et al. | |
| 2014/0071078 | A1 | 3/2014 | Hayton | |
| 2014/0072794 | A1 | 3/2014 | Rundle et al. | |

FOREIGN PATENT DOCUMENTS

| | | | | |
|---|---|---|---|---|
| DE | 19849199 A1 * | 4/2000 | ............ | A47G 1/175 |
| WO | 2009/151686 A2 | 12/2009 | | |

* cited by examiner

*Primary Examiner* — Patricia L Nordemeyer
(74) *Attorney, Agent, or Firm* — Downey Brand LLP

(57) ABSTRACT

A stretch release adhesive is disclosed. The stretch release adhesive can be used for extracting an electrical component from an interior surface of a housing of a mobile computing device. The stretch release adhesive can have a double-sided adhesive body configured to adhere the component to the interior surface of the housing. A portion of the double-sided adhesive body is configured to extend out from between the electrical component and the interior surface of the housing to provide a graspable portion. When the stretch release adhesive is adhered between the electrical component and the internal surface of the housing, the stretch release adhesive can receive a pulling force at the graspable portion. If pulled with enough force, the stretch release adhesive will extend outwardly from between the electrical component and the internal surface of the mobile computing device, then completely release the electrical component from the mobile computing device.

20 Claims, 12 Drawing Sheets

PULL TAB DESIGN FOR STRETCH RELEASE ADHESIVE

CROSS-REFERENCE TO RELATED APPLICATIONS

The present application claims the benefit of U.S. Provisional Application No. 61/873,765, entitled "PULL TAB DESIGN FOR STRETCH RELEASE ADHESIVE" filed Sep. 4, 2013, the content of which is incorporated herein by reference in its entirety for all purposes.

FIELD

The described embodiments relate generally to component removal apparatuses. More specifically, disclosed herein are component removal apparatuses that sufficiently secure a component within a portable computing device yet provide ease of removal for replacement or servicing.

BACKGROUND

Manufacturers continually strive to enhance the physical qualities of portable computing devices so as to provide an excellent user experience and keep an edge on their competitors. Notably, the widths and lengths of most portable computing devices—such as smart phones and laptops—have recently remained somewhat constant, because a threshold amount of surface area is required to provide a pleasant user experience (e.g., for large user interfaces displayed on smart phones or physical keyboards of laptops). Other physical qualities of portable computing devices, however—including thickness (i.e., height) and weight—can continue to be reduced to provide an increase in overall user satisfaction. As a result, manufacturers are focused on developing new materials and designs that reduce the overall height and/or weight of portable computing devices.

Presently, there are several factors that limit the potential reduction of height that can be applied to a portable computing device, e.g., a smart phone. In many cases, the most limiting factor is the battery included in the smart phone, which remains somewhat large with respect to the overall volume of the smart phone. Notably, the battery must be secured within the smart phone such that the battery remains in place in the event of a fall and does not damage other electronics included within the smart phone. One popular battery-securing technique involves applying a relatively thick adhesive layer to the battery, but this limits potential for reductions in height and can make it difficult to remove the battery for replacement or servicing. Moreover, while measures to simply thin the adhesive layer would result in increased potential for height reduction, such measures would also compromise the stability of the battery within the portable computing device, which is unacceptable.

SUMMARY

This paper describes various embodiments that relate to component removal apparatuses to be used within computing devices. In one embodiment, a stretch release adhesive is set forth for extracting a component that is secured to an interior surface of a housing. The stretch release adhesive can include a double-sided adhesive body configured to adhere the component to the interior surface of the housing. A portion of the double-sided adhesive body can be configured to extend out from between the component and the interior surface of the housing to provide a graspable portion. Additionally, the graspable portion can be configured to receive a removing force and transfer the removing force to a plurality of leg portions of the double-sided adhesive body. In this way, the plurality of leg portions can be disposed between the component and the interior surface of the housing, enabling the component to be removed In some embodiments, a method for producing a stretch release adhesive configured to both secure a component to an interior surface of a housing and to extract the component from the interior surface of the housing. The method can include a step of placing a stretch release adhesive between the component and the interior surface of the housing. The stretch release adhesive can include a double-sided adhesive body having a plurality of leg portions, and a graspable portion extending at a distal end of the plurality of leg portions. According to the method, a pulling force applied to the graspable portion can cause the stretch release adhesive to bend in a manner that releases the component from the interior surface.

In yet another embodiment, a stretch release adhesive is set forth having a double-sided adhesive body configured to attach a battery to an internal surface of a mobile computing device. The stretch release adhesive can include a plurality of legs tapered at a distal end of the stretch release adhesive. Further, the stretch release adhesive can include a gap between the plurality of legs that extends over a majority of a length of the battery. A graspable portion can be configured on the stretch release adhesive to extend out from between the battery and the internal surface of the mobile computing device. In this way, when the stretch release adhesive is adhered between the battery and the internal surface of the mobile computing device, the stretch release adhesive can receive a pulling force at the graspable portion. The pulling force can cause the stretch release adhesive to stretch outwardly from between the battery and the internal surface of the mobile computing device, and release the battery from the mobile computing device without damaging the battery.

Other aspects and advantages of the invention will become apparent from the following detailed description taken in conjunction with the accompanying drawings that illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION

Figure 1A:
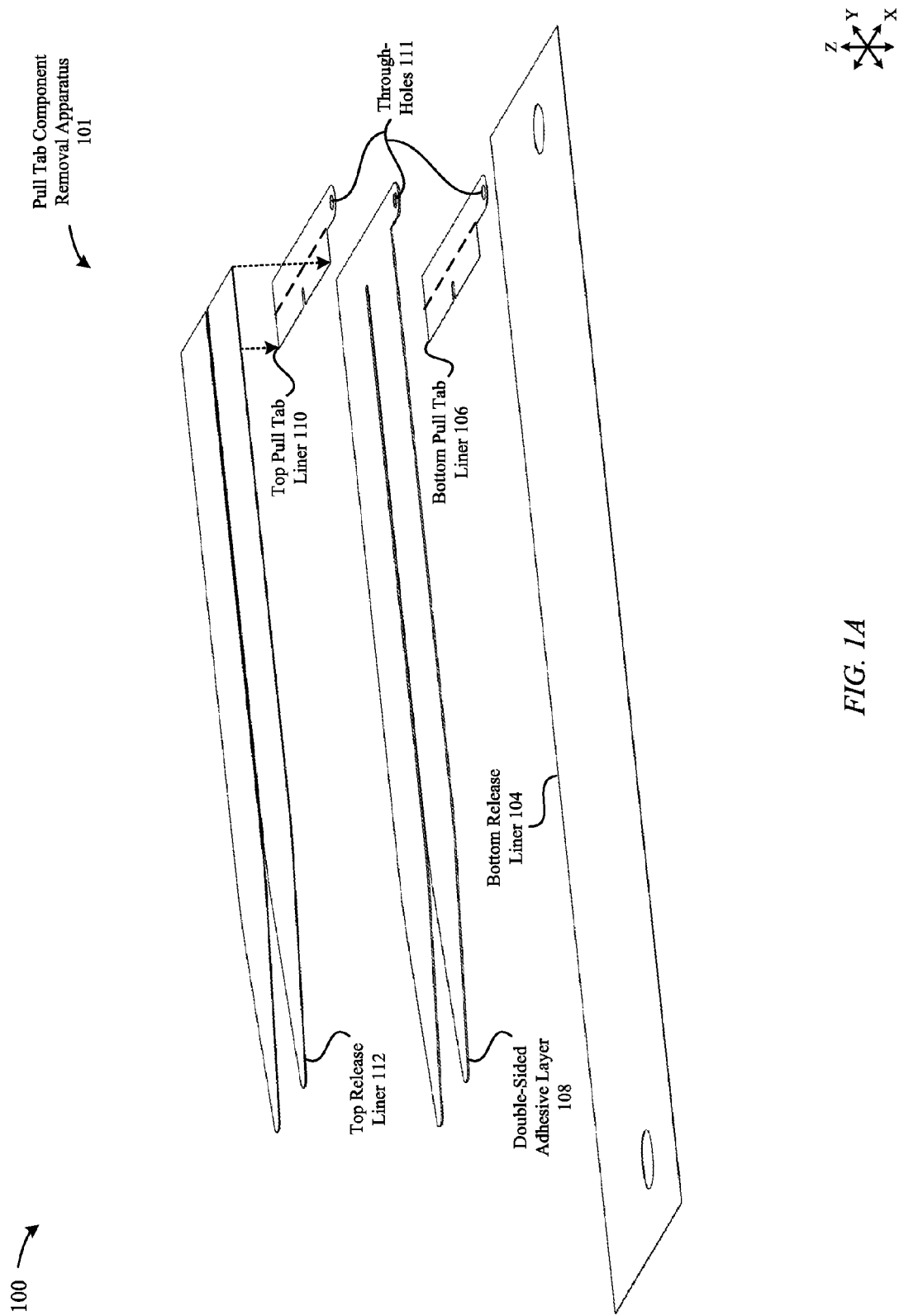
FIGS. 1A-1B illustrate exploded views of a pull tab component removal apparatus, according to one embodiment of the invention.

Representative applications of methods and apparatus, according to the present application, are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings that form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made, without departing from the spirit and scope of the described embodiments.

As set forth above, one common technique for securing a component (e.g., a battery) within a computing device involves using an adhesive layer. When the component needs to be removed from the computing device, service technicians are required to pry the component away from the housing of the computing device, which can damage the component and/or housing. One technique that can be used to help mitigate this problem involves using a pull tab that facilitates a removal of the adhesive layer from between the component and the housing. Accordingly, the invention sets forth a pull tab component removal apparatus used for extracting a component secured to an interior surface of a housing by an adhesive layer. The pull tab component removal apparatus includes a stretch-release adhesive that is placed between the component and the housing, and is designed to facilitate removal of the stretch-release adhesive by providing a means (i.e., the pull tab) by which to grip the stretch-release adhesive and pull it without tearing it through the creation of stress concentrations.

The pull tab component removal apparatus includes at least three main features that provide the aforementioned benefits, which include a loop feature, a fold feature, and a double-sided adhesive layer that is bifurcated into at least two "legs." Specifically, the loop is a small hole in the pull tab that allows the pull tab to be retrieved and unfolded when the pull tab is incorporated into the housing and folded into a tight space (e.g., to conserve space within the housing). By engaging the loop, the pull tab can be lifted out of the housing past an upper plane of the component as the fold comes undone, enabling the entire width of the pull tab to be gripped. Notably, gripping the entire width of the pull tab prevents local stress concentrations and increases the likelihood that the double-sided adhesive layer can be removed without tearing. The double-sided adhesive layer ensures that force is being applied to two discreet, narrow strips rather than one wide one. This allows the double-sided adhesive layer to neck or stretch more as the pulling force is applied, which reduces the surface area that is affected by pulling on the pull tab.

Notably, the pull tab component removal apparatus can be complemented with a variety of components that assist in the removal process of the double-sided adhesive layer. For example, the device housing can include a component—such as an "arm" that is a part of the device housing—that is positioned and shaped such that, when the graspable portion of the double-sided adhesive layer is pulled on, the arm substantially reduces the amount of friction that is placed against the internal component as the double-sided adhesive layer unfurls. More specifically, the sharp edge prevents the double-sided adhesive layer from lifting upward and contacting the bottom edge of the internal component, which can help reduce the likelihood of damage being made to the internal component during a removal process (e.g., a battery bending). In another example, the device housing can be placed into an apparatus that is configured to secure the device housing and lower a sharp edge (e.g., a blade) along the internal component where the pull tab is placed. The pull tab can then be pulled on while the device housing and blade remain in a fixed position, which provides the same benefits of friction reduction described herein during the removal process.

According to one embodiment, a pull tab component removal apparatus can include at least two leg portions, and, in some configurations, each leg portion can taper at the same end. The pull tab component removal apparatus can further include a graspable portion that runs parallel to the two leg portions and is joined with the two leg portions. Specifically, this graspable portion extends out from between the component and the housing of the device, and enables a service technician or a component of an apparatus to firmly and uniformly grip the graspable portion and apply force to remove the adhesive layer. In particular, when the force is applied in a direction parallel to the bonding plane provided by the adhesive layer, substantially uniform force is exerted on each leg via the graspable portion. As a result, each leg furls and eliminates the bond provided by the adhesive layer. In this manner, the adhesive layer can be removed from between the component and the housing, and the component can be freed from the housing.

These and other embodiments are discussed below with reference to FIGS. 1A-1B, 2A-2B, 3A-3B, and 4; however, those skilled in the art will readily appreciate that the detailed description given herein with respect to these figures is for explanatory purposes only and should not be construed as limiting. It is noted that the elements illustrated in FIGS. 1A-1B, 2A-2B, 3A-3B, and 4 are not drawn to scale, nor do they represent dimensions that are relative to one another. In contrast, the elements can be of any dimension without departing from the scope of the invention.

Figure 1B:
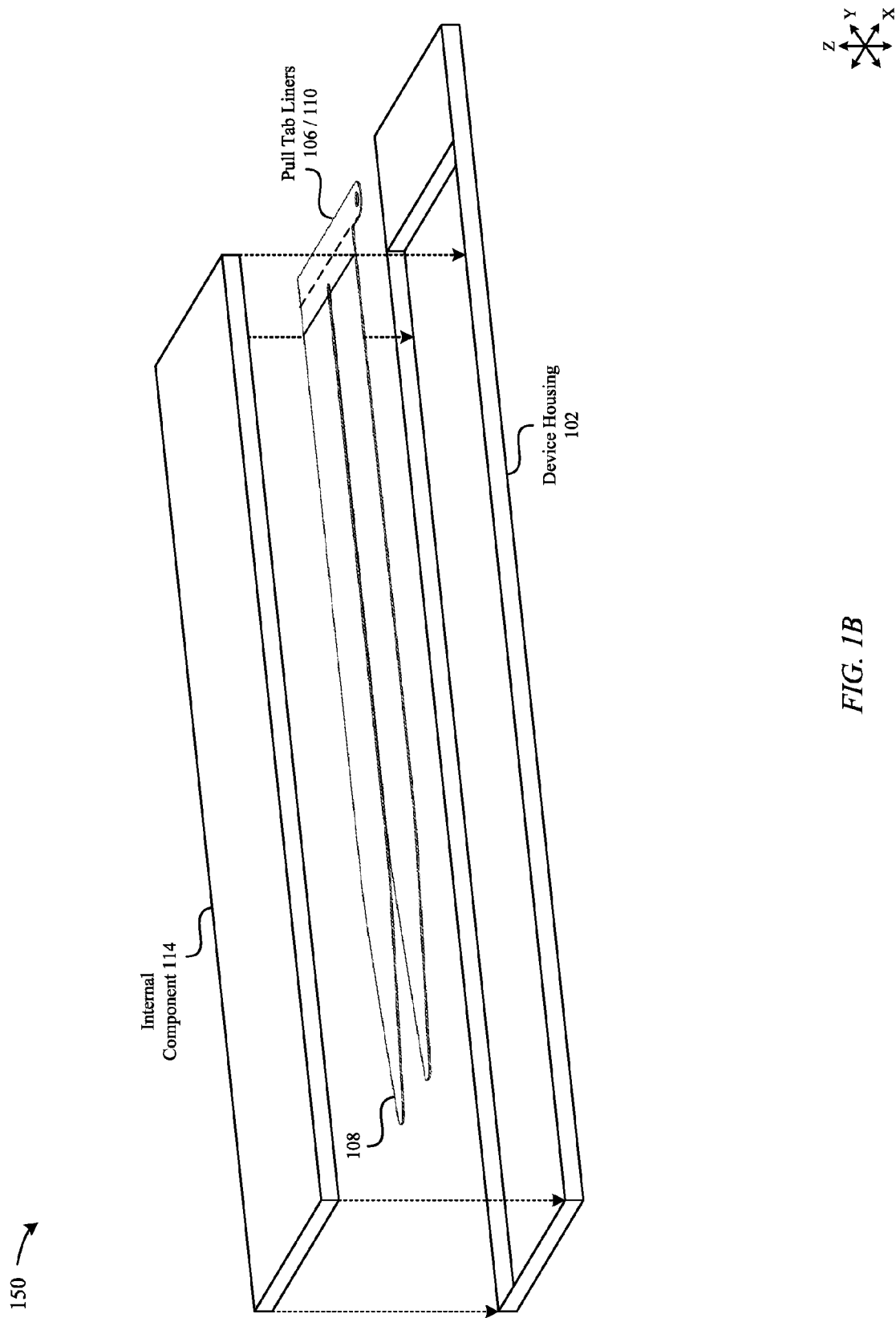

FIGS. 1A-1B illustrate exploded views of a pull tab component removal apparatus 101, according to one embodiment of the invention. In particular, FIG. 1A illustrates an exploded view 100 of the pull tab component removal apparatus 101 after being manufactured, and prior to being installed into a housing of a device. As shown, the pull tab component removal apparatus 101 includes a bottom release liner 104, a bottom pull tab liner 106, a double-sided adhesive layer 108, a top pull tab liner 110, and a peel-away top release liner 112. As described in greater detail below, the pull tab component removal apparatus 101 is configured such that, when being used to secure a component within the housing of the device, a technician removes the bottom release liner 104 and the top release liner 112 to expose the double-sided adhesive layer 108. Thereafter, a first side (i.e., top) of the double-sided adhesive layer 108 can be adhered to a surface within the housing of the device, and a second side (i.e., bottom) of the double-sided adhesive layer 108 can be adhered to a component that is included in the housing of the device to thereby secure the component within the housing of the device. Notably, the pull tab liners 106/110 can remain in place when both the top release liner 112 and the bottom release liner 104 are removed from the double-sided adhesive layer 108. The pull tab liners 106/110 provide a graspable, non-sticky surface that extends out from between the component and the housing of the device, and enables the double-sided adhesive layer 108 to be subsequently removed when necessary (e.g., when a component swap-out is required). In particular, the pull tab liners 106/110, when grasped and pulled on in a direction that is parallel to the bonding plane provided by the double-sided adhesive layer 108, cause each leg of the double-sided adhesive layer 108 to furl, which eliminates the bond between the component and the housing of the device and enables the component to be removed.

Notably, the elements included in the pull tab component removal apparatus 101 can be manufactured according to a variety of techniques and composed using a variety of materials. For example, the bottom pull tab liner 106 and the top pull tab liner 110 can be manufactured using siliconized polyethylene terephthalate (PET) with a thickness of 0.025 millimeters (MM)±0.005 MM. Similarly, the bottom release liner 104 and the top release liner 112 can also be manufactured using siliconized PET with thicknesses of 0.05 MM±0.01 MM and 0.10 MM±0.01 MM, respectively. The double-sided adhesive layer 108 can be manufactured using any adhesive material with properties that are suitable to enable the pull tab component removal apparatus 101 to function according to the various techniques described herein. For example, a synthetic rubber adhesive (e.g., TESA® Adhesive 70415) can be used, with a thickness of 0.15 MM±0.01 MM.

The dimensions of the double-sided adhesive layer 108, bottom pull tab liner 106, top pull tab liner 110, and graspable portion can vary depending on the embodiment and application. The dimensions can be configured such that a ratio between the width of the double-sided adhesive layer 108 and width of the graspable portion allows the double-sided adhesive layer 108 to be removed from a component without tearing the double-sided adhesive layer 108. In some embodiments, the double-sided adhesive layer 108 has a width that is equal to or less than the width of the graspable portion. In this way, any pulling force received at the graspable portion can be adequately distributed to the double-sided adhesive layer 108 in a manner that mitigates tearing of the double-sided adhesive layer 108 during the release of a component.

FIG. 1B illustrates an exploded view 150 of the double-sided adhesive layer 108 when used to secure an internal component 114 within a device housing 102. As shown in FIG. 1B, each of the bottom release liner 104 and the top release liner 112 are removed from the double-sided adhesive layer 108, while both the bottom pull tab liner 106 and the top pull tab liner 110 remain adhered to the double-sided adhesive layer 108. As previously noted above, the bottom pull tab liner 106 and the top pull tab liner 110 remain so that a technician can grip an insulated (i.e., non-sticky) portion of the double-sided adhesive layer 108 that extends out from between the device housing 102 and the internal component 114. In this way, the technician can pull on (i.e., stretch) the double-sided adhesive layer 108 in a direction that is substantially parallel to the plane of adhesion to gradually disrupt the adhesion and enable the internal component 114 to be removed from the device housing 102. Those having skill in the art will understand that the graspable portion of the double-sided adhesive layer 108 (i.e., the pull tab liners 106/110) is not limited to a single side of the device housing 102 as illustrated in FIG. 1B and can be oriented such that the internal component 114 can be removed from the device in any direction that is most convenient with respect to how other components are configured within the device.

Figure 2A:
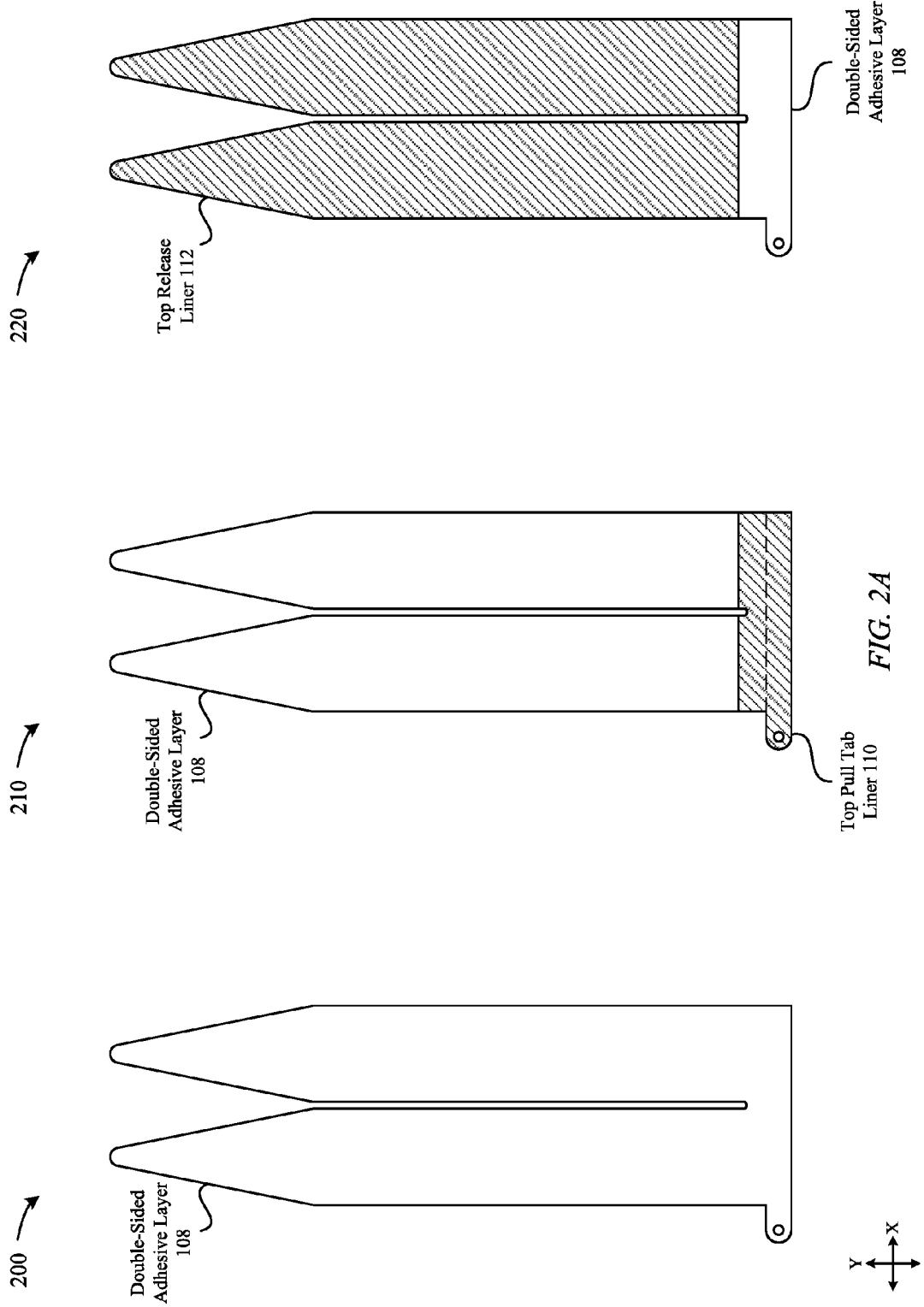
FIGS. 2A-2B illustrate birds-eye perspective views of the pull tab component removal apparatus of FIGS. 1A-1B, according to one embodiment of the invention.
Figure 2B:
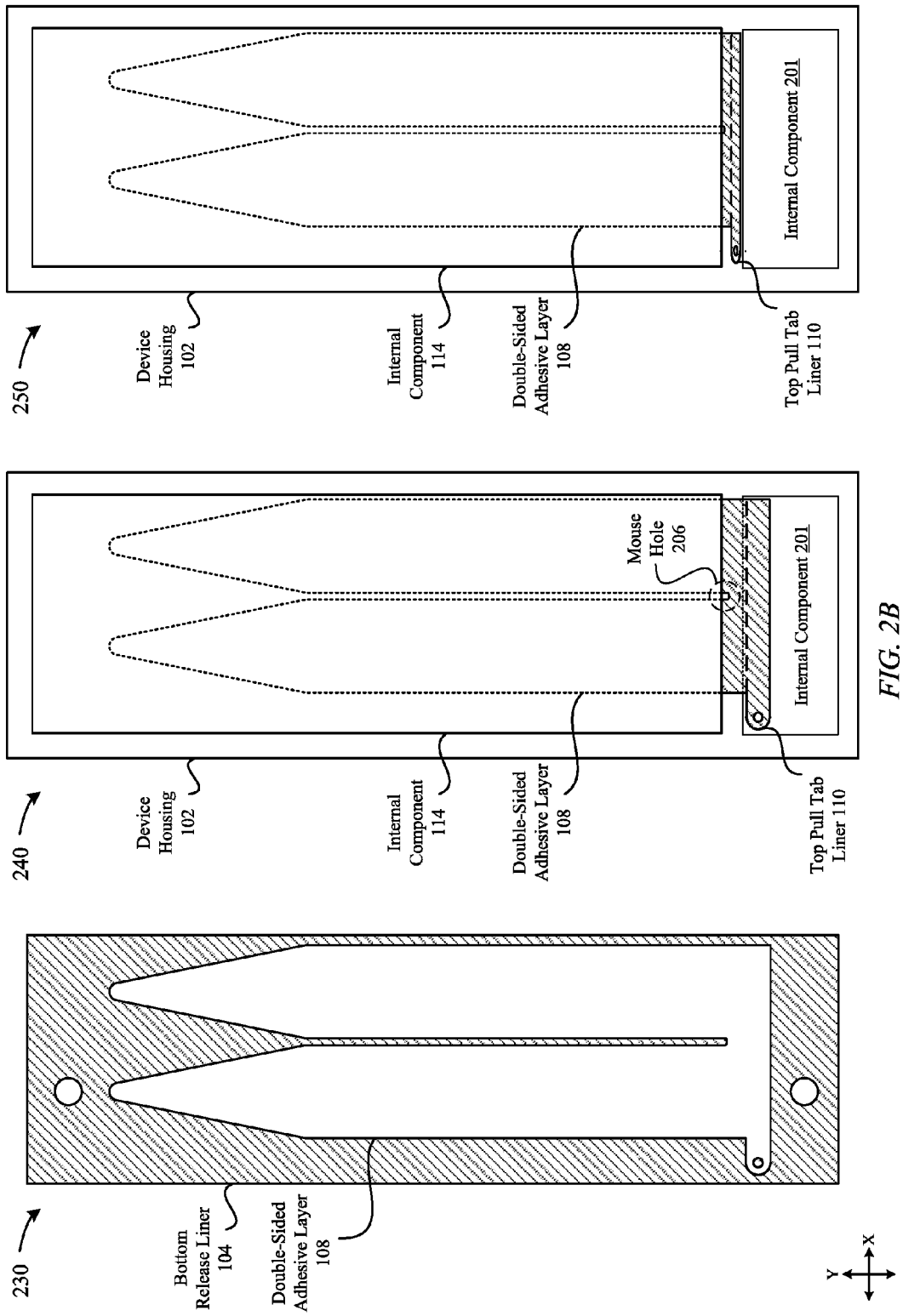

FIGS. 2A-2B illustrate birds-eye perspective views of the pull tab component removal apparatus 101 of FIGS. 1A-1B, according to one embodiment of the invention. In particular, FIG. 2A illustrates a birds-eye perspective view 200 of the top of the double-sided adhesive layer 108, where the top pull tab liner 110 and the top release liner 112 are excluded from the birds-eye perspective view 200. As shown in the birds-eye perspective view 200, and according to one embodiment, the double-sided adhesive layer 108 is uniquely shaped to include two separate leg portions that each taper at one end of the double-sided adhesive layer 108. The tapered shape of the separate leg portions (or a single leg, in some embodiments) allows for a release force to decrease as the double-sided adhesive layer 108 is being pulled and released from a component. The decrease in release force ensures that the leg portions will not tear or rip when releasing the double-sided adhesive layer 108 from the component. It is noted that the embodiments are not limited to two leg portions, and that other numbers of leg portions (e.g., one leg, three legs, four legs) are considered and can be used to provide the same or similar benefits discussed herein. As described above, the legs of the double-sided adhesive layer 108 furl when removing force is applied to the graspable portion of the double-sided adhesive layer 108, which eliminates the bond between the internal component 114 and the device housing 102 and enables the internal component 114 to be removed. The double-sided adhesive layer 108 further includes the through-hole 111, which, although not specifically required by the embodiments described herein, beneficially provide a loop that can be grasped to enable the double-sided adhesive layer 108 to be retrieved from between the internal component 114 and the device housing 102. Once retrieved, the graspable portion is exposed and can be grasped by a technician or an apparatus configured to extract the double-sided adhesive layer 108.

FIG. 2A also illustrates a birds-eye perspective view 210 of the top of the double-sided adhesive layer 108, which, as shown, includes the top pull tab liner 110. Notably, the birds-eye perspective view 210 highlights a bend that can be included in the top pull tab liner 110 to enable the lower portion of the double-sided adhesive layer 108 to be folded between a space that exists between one side of the internal component 114 and other components included in the device housing 102, an example of which is illustrated in clearer detail in FIGS. 3A-3B. The bend can be established according to a variety of techniques, including pre-folding the top pull tab liner 110, partially slicing into the top pull tab liner 110, or perforating the top pull tab liner 110. In some embodiments, the double-sided adhesive layer 108 can also be manufactured to include a bend at an area to match the bend established in the top pull tab liner 110 using the same techniques described above. Similarly, although not illustrated in FIG. 2A, the bottom pull tab liner 106 can be manufactured to include a bend at an area to match the bend established in the top pull tab liner 110 using the same techniques described above. In this manner, the double-sided adhesive layer 108—and the pull tab liners 106/110, which remain adhered to the double-sided adhesive layer 108 when installed into the device housing 102—can bend substantially beyond a ninety degree angle and allow the lower portion of the double-sided adhesive layer 108 that extends out from between the internal component 114 and the device housing 102 to be folded and tucked-in. In this manner, space can be conserved within the device housing 102 while continuing to enable the double-sided adhesive layer 108 (and the pull tab liners 106/110 adhered thereto) to be unfolded in order to provide a graspable surface to remove the double-sided adhesive layer 108.

FIG. 2A additionally illustrates a birds-eye perspective view 220 of the double-sided adhesive layer 108. In particular, the birds-eye perspective view 220 illustrates the top release liner 112, which, as shown, covers the majority of the surface area of the top of the double-sided adhesive layer 108 and terminates along the area that is covered by the top pull tab liner 110. Although not illustrated in the birds-eye perspective view 220, the bottom release liner 104 covers the majority of the surface area of the bottom of the double-sided adhesive layer 108, however a particular portion of the bottom release liner 104 is insulated from the double-sided adhesive layer 108 by way of the bottom pull tab liner 106. It is additionally noted that, while a specific shape for the double-sided adhesive layer 108 (and the liners included therewith) is shown throughout the figures and described herein, embodiments of the invention encompass any shape that provides the functionality and features described herein (i.e., where the double-sided adhesive layer 108 furls when pulled on at an angle substantially parallel to the bonding plane provided by the double-sided adhesive layer 108).

FIG. 2B illustrates additional birds-eye perspective views of the double-sided adhesive layer 108. In particular, a birds-eye perspective view 230 illustrates both the bottom release liner 104 and the double-sided adhesive layer 108. It is noted that the bottom release liner 104 is not required to extend beyond the surface area of the double-sided adhesive layer 108. FIG. 2B further illustrates a birds-eye perspective view 240 of the double-sided adhesive layer 108. In particular, the birds-eye perspective view 240 illustrates the manner in which the double-sided adhesive layer 108 adheres the internal component 114 to the device housing 102, at least according to one embodiment of the invention. As shown in the birds-eye perspective view 250, the device housing 102 can include an internal component 201 that is disposed within the device housing 102 such that a gap exists between the internal component 114 and the internal component 201. In particular, the portion of the double-sided adhesive layer 108 that extends out from between the device housing 102 and the internal component 114 can be unfolded (as illustrated in the birds-eye perspective view 240) and graspable, or folded (as illustrated in the birds-eye perspective view 250) and tucked-in between the aforementioned gap that exists between the internal component 114 and the internal component 201.

Notably, the double-sided adhesive layer 108 can be positioned relative to the internal component 114 such that, given the shape of the double-sided adhesive layer 108, a "mouse hole" is established, an example of which illustrated in FIG. 2B as the mouse hole 206. In particular, the mouse hole 206 provides the benefit of assisting in establishing substantially uniform force to each of the legs of the double-sided adhesive layer 108 when force is applied to the graspable portion (i.e., the pull tab liners 106/110) of the double-sided adhesive layer 108. This substantially uniform force eases the removal of the double-sided adhesive layer 108 from between the internal component 114 and the device housing 102, and helps prevent tearing that might otherwise occur if no mouse hole is present. A notch in the pull tab liners 106/110 can be incorporated as a failsafe such that if double-sided adhesive layer 108 does not release after a certain amount of pulling force is applied, the pull tab can breakaway at the notch. In this way, double-sided adhesive layer 108 will be more inclined to rip at the notch when there is no release from the double-sided adhesive layer 108, rather than ripping through the double-sided adhesive layer 108.

As described in greater detail below, in some embodiments, the internal component 201 can be positioned and shaped such that, when the graspable portion (i.e., the pull tab liners 106/110) of the double-sided adhesive layer 108 is pulled on, the internal component 201 substantially reduces the amount of friction that is placed against the internal component 114 as the double-sided adhesive layer 108 unfurls. In particular, and according to one embodiment, the internal component 201 can include a sharp edge that lies parallel to the bottom portion of the internal component 114 and perpendicular to the direction in which the double-sided adhesive layer 108 is pulled on during the removal process. According to this configuration, the sharp edge prevents the double-sided adhesive layer 108 from lifting upward and contacting the bottom edge of the internal component 114, which can help reduce the likelihood of damage being made to the internal component 114 during a removal process (e.g., a battery bending). As a result, the overall yield of removed and reusable internal components can be increased, which can enable both the manufacturer of the device housing 102 and/or repair technicians to provide better service to their customers.

Figure 3A:
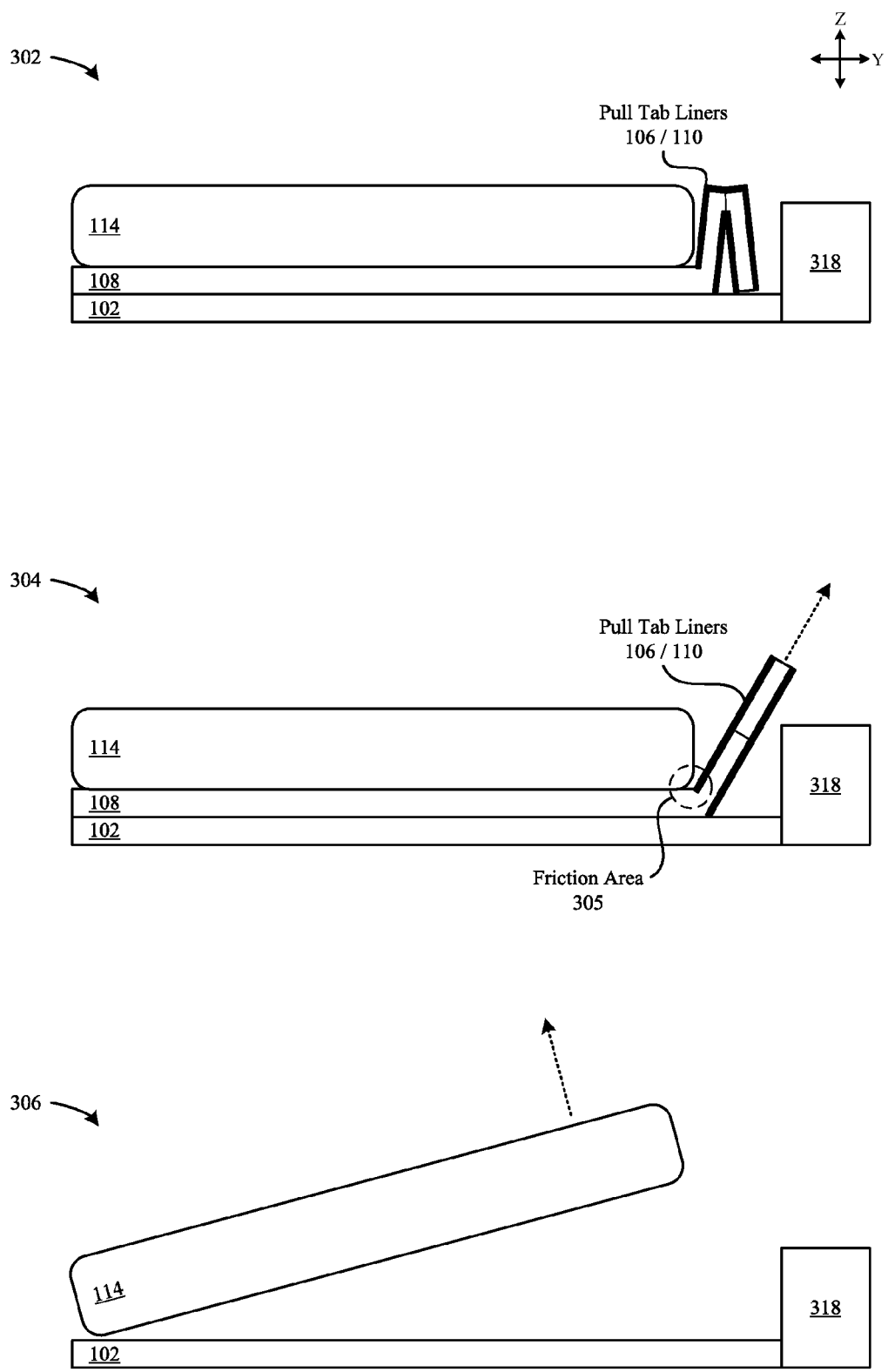
FIGS. 3A-3B illustrate cross-sectional perspective views of the pull tab component removal apparatus of FIGS. 1A-1B, according to one embodiment of the invention.
Figure 3B:
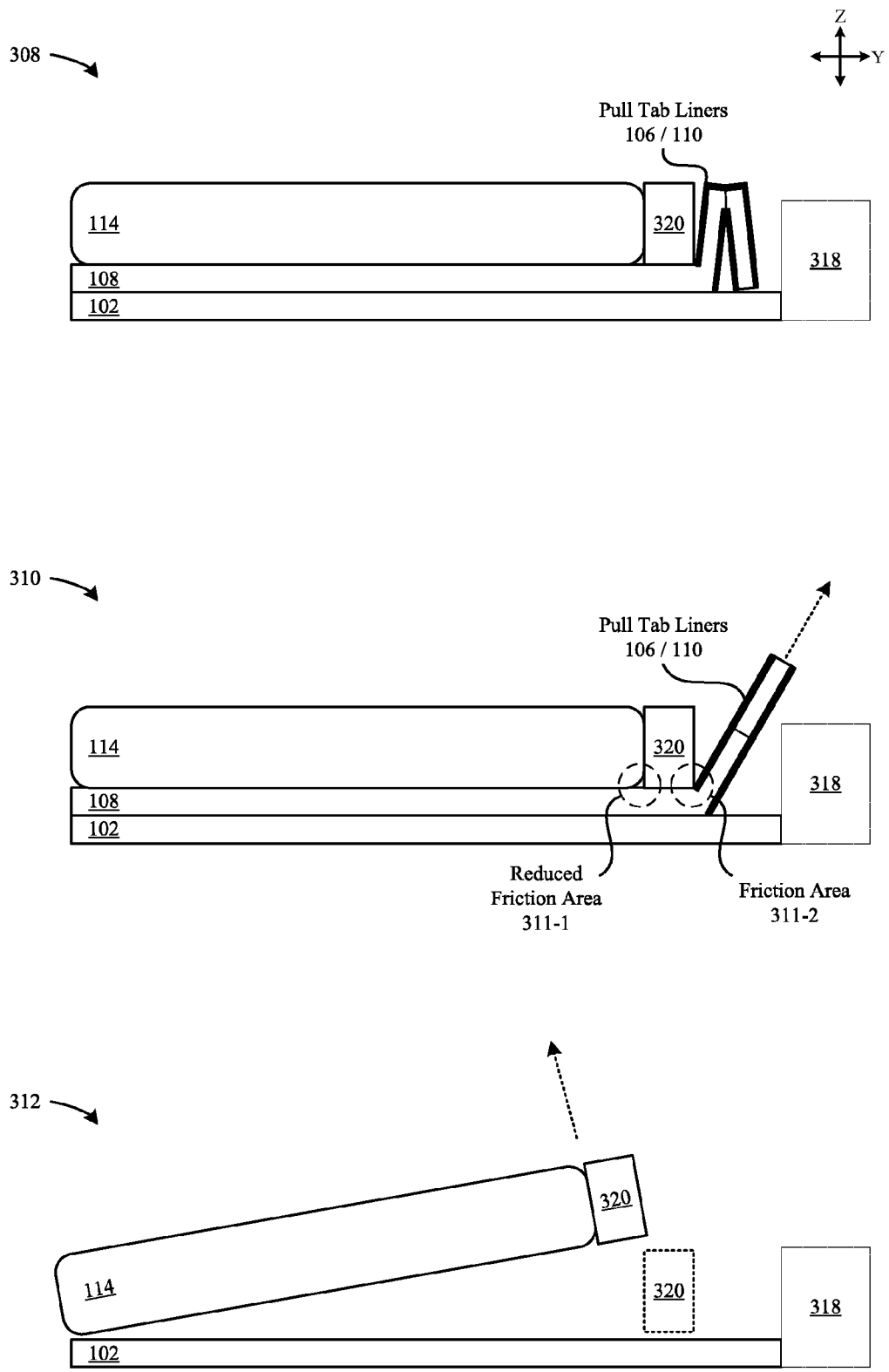

FIGS. 3A-3B illustrate cross-sectional perspective views of the pull tab component removal apparatus 101 of FIGS. 1A-1B, according to one embodiment of the invention. In particular, FIG. 3A includes cross-sectional perspective views 302, 304, and 306, which sequentially represent a process for removing the internal component 114 from the device housing 102 when no friction-reducing edge (e.g., the internal component 201) is included. Perspective view 302 includes the device housing 102, the double-sided adhesive layer 108, the internal component 114, the pull tab liners 106/110, and an optional internal component 318. As shown in the cross-sectional perspective view 302, the double-sided adhesive layer 108 adheres the internal component 114 to the device housing 102, where a portion of the double-sided adhesive layer 108 (and the pull tab liners 106/110) extends out from between the internal component 114 and the device housing 102 and is configured in a folded position. It is noted that protruding portion of the double-sided adhesive layer 108 is not limited to being folded only a single time, and that any number of folds can exist to enable the extended portion of the double-sided adhesive layer 108 to fit within different sized spaces within the device housing 102.

FIG. 3A also illustrates a cross-sectional perspective view 304, where the portion of the double-sided adhesive layer 108 (and the pull tab liners 106/110) that extends out from between the internal component 114 and the device housing 102 is configured in an unfolded position. As mentioned above, the double-sided adhesive layer 108 (and the pull tab liners 106/110) can include through-holes 111 to assist in the unfolding process when the space that exists between the internal component 114 and the internal component 318 requires the protruding portion of the double-sided adhesive layer 108 (and the pull tab liners 106/110) to be tightly folded/packed (and therefore is hard to unfold). Once unfolded (as illustrated in the cross-sectional perspective view 304), the double-sided adhesive layer 108 can be gripped via the pull tab liners 106/110 and pulled on to cause the double-sided adhesive layer 108 to unfurl between the internal component 114 and the device housing 102. Notably, and as previously set forth herein, some friction can be established against the bottom rightmost portion of the internal component 114 (relative to FIG. 3A and represented by friction area 305), and can depend largely on the angle at which the double-sided adhesive layer 108 is pulled on relative to the bonding plane provided by the double-sided adhesive layer 108. For example, pulling the double-sided adhesive layer 108 at a forty-five degree angle to the bonding plane will establish greater friction than, say, pulling the double-sided adhesive layer 108 at a ten degree angle to the bonding plane. In that regard, it is best practice to minimize the angle at which the double-sided adhesive layer 108 is pulled on with respect to the bonding plane. Once completely removed, as represented by the cross-sectional perspective view 306, the internal component 114 can be lifted out from the device housing 102, where servicing or replacement of the internal component 114 can be carried out. Subsequently, a replacement pull tab component removal apparatus 101 can be used to secure the serviced or replacement internal component 114 back into the device housing 102 according to the techniques described above in conjunction with FIGS. 1A-1B.

In addition, FIG. 3B illustrates a cross-sectional perspective view of the pull tab component removal apparatus 101 of FIGS. 1A-1B, according to another embodiment of the invention. In particular, FIG. 3B includes cross-sectional perspective views 308, 310, and 312, which sequentially represent a process for removing the internal component 114 from the device housing 102 when a friction-reducing edge is included. As shown in FIG. 3B, perspective view 308 includes the device housing 102, the double-sided adhesive layer 108, the internal component 114, the pull tab liners 106/110, and an optional internal component 318. As shown in the cross-sectional perspective view 308, the double-sided adhesive layer 108 adheres the internal component 114 to the device housing 102, where a portion of the double-sided adhesive layer 108 (and the pull tab liners 106/110) extends out from between the internal component 114 and the device housing 102 and is configured in a folded position. Also shown in the cross-sectional perspective view 308 is an edge 320, which, in one embodiment, represents at least a portion of the internal component 201 illustrated in FIG. 2B and described above. Alternatively, the edge 320 can represent a "cap" or "shield" that is attached to the internal component 114 in order to strengthen its rigidity and reduce the amount of friction that occurs against the bottom rightmost edge (relative to FIG. 3B) of the internal component 114. Notably, and as described above, this can help prevent damage (e.g., bending) from occurring to the internal component 114, which increases the likelihood that the internal component 114 can be repaired or salvaged after being removed from the device housing 102. This is especially important considering the high cost and sensitivity of parts that are commonly being included in devices, e.g., batteries, memories, circuit boards, and the like.

FIG. 3B also illustrates a cross-sectional perspective view 310, where the portion of the double-sided adhesive layer 108 (and the pull tab liners 106/110) that extends out from between the internal component 114 and the device housing 102 is configured in an unfolded position. Notably, with the edge 320 in place, the amount of friction against the bottom rightmost portion of the internal component 114 (relative to FIG. 3B) is reduced, which is represented by reduced friction area 311-1. Instead, the friction is at least partially transferred to the edge 320, which is represented by friction area 311-2, and, as described above, can provide the benefit of reducing the overall stress made to the internal component 114 during the removal process. Once unfolded (as illustrated in the cross-sectional perspective view 310), the double-sided adhesive layer 108 can be gripped via the pull tab liners 106/110 and pulled on to cause the double-sided adhesive layer 108 to unfurl between the internal component 114 and the device housing 102. Once completely removed, as represented by the cross-sectional perspective view 312, the internal component 114 can be lifted out from the device housing 102, where servicing or replacement of the internal component 114 can be carried out.

In some embodiments it may be desirable to pull the graspable portion of the double-sided adhesive layer 108 in a direction other than an optimal pull direction (e.g., parallel to the double-sided adhesive layer) for releasing the double-sided adhesive layer 108 from a component. To facilitate a modified pull direction, as discussed further herein, a structure or mechanism fixed to the base of a component holding device can be used to redirect the pulling force. Examples of possible implementations for such a structure can include a blade structure (preferably one coated in or comprised of a low surface energy material), a low friction material, or a roller structure. Embodiments of the component holding device (also referred to as a removal apparatus) are set forth in FIGS. 4A-4E.

Figure 4A:
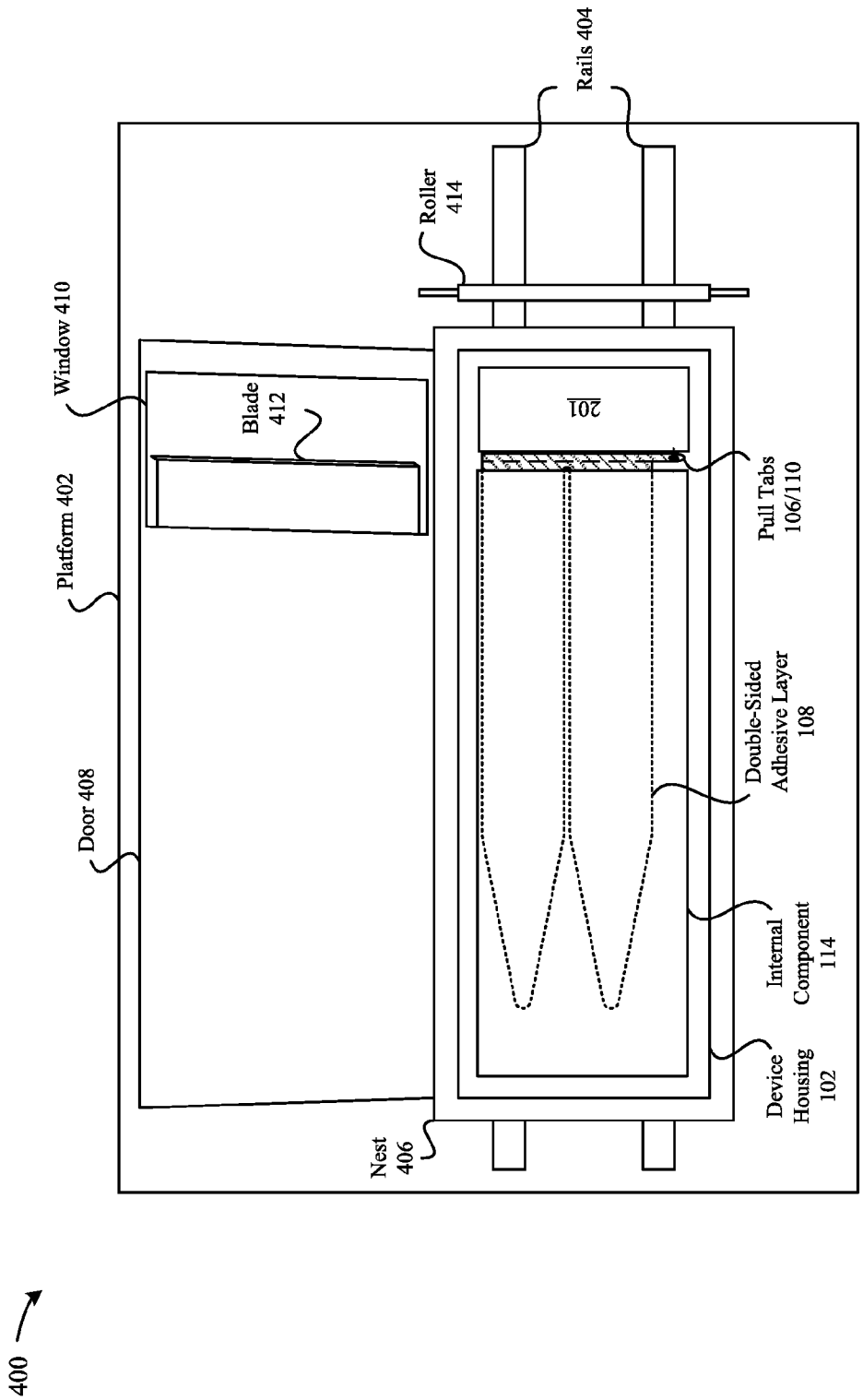
FIGS. 4A-4E illustrate conceptual diagrams of a removal apparatus configured operate with the pull tab component removal apparatus of FIGS. 1A-1B, according to one embodiment of the invention.
Figure 4B:
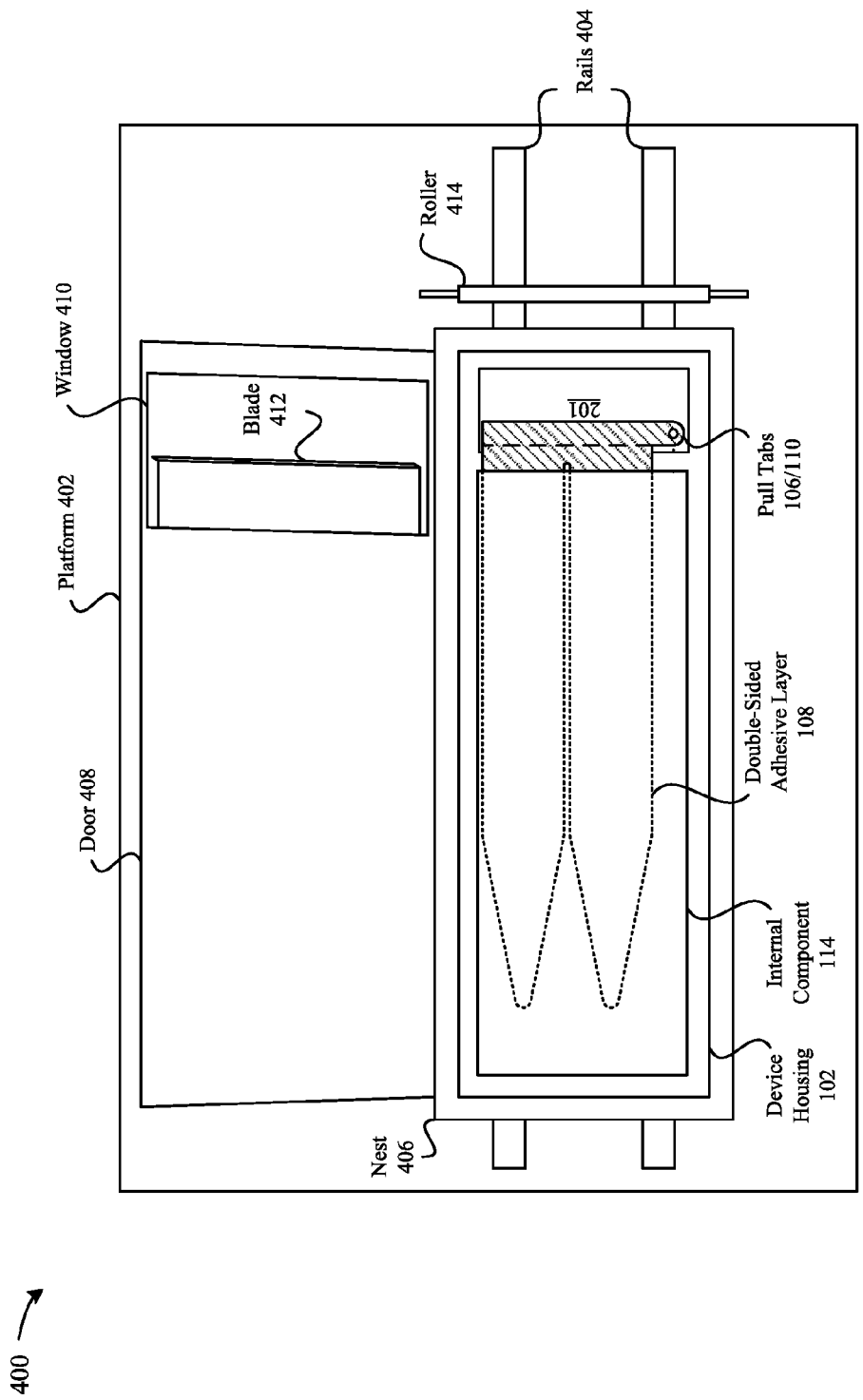

FIGS. 4A-4E illustrate conceptual diagrams of a removal apparatus 400 configured operate with the pull tab component removal apparatus of FIGS. 1A-1B, according to one embodiment of the invention. Notably, the removal apparatus 400 can be used when internal components of the device housing 102 are not included to provide a friction-reducing edge. As shown in FIG. 4A, the removal apparatus 400 includes a platform 402, rails 404, a nest 406, and rollers 414. As indicated by the illustration in FIG. 4A, the nest 406 is configured to support and lock-in place the device housing 102 and to move about the platform 402 via the rails 404. The nest 406 includes a door 408 that is hinged to cover the nest 406 when not in an open/lifted position. The door 408 includes both a window 410 and a blade 412, where the window 410 enables the blade 412 to be properly positioned over the pull tabs 106/110 when preparing to remove the internal component 114 from the device housing 102. The blade and rollers can be implemented using a variety of materials (e.g., Teflon) and shapes, including any suitable low friction material and/or coating. Additionally, the roller 414 can facilitate a change in direction of a pulling force that removes the double-sided adhesive layer 108 from device housing 102. Moreover, the roller 414 can be used as a mechanism to collect materials (e.g., adhesives, liners, etc.) during a component removal process, alone or in combination with other mechanical devices for collecting and directing materials (e.g., a gutter, guide, blade, etc.). Notably, in FIG. 4A, the pull tabs 106/110 are configured in a folded position and tucked between the internal component 114 and the internal component 201, as previously discussed herein, and, in FIG. 4B, the pull tabs 106/110 are configured in an unfolded position. Again, the loop provided by the through-holes 111 can be used to provide a loop that enables the pull tabs 106/110 to be grasped and unfolded.

Figure 4C:
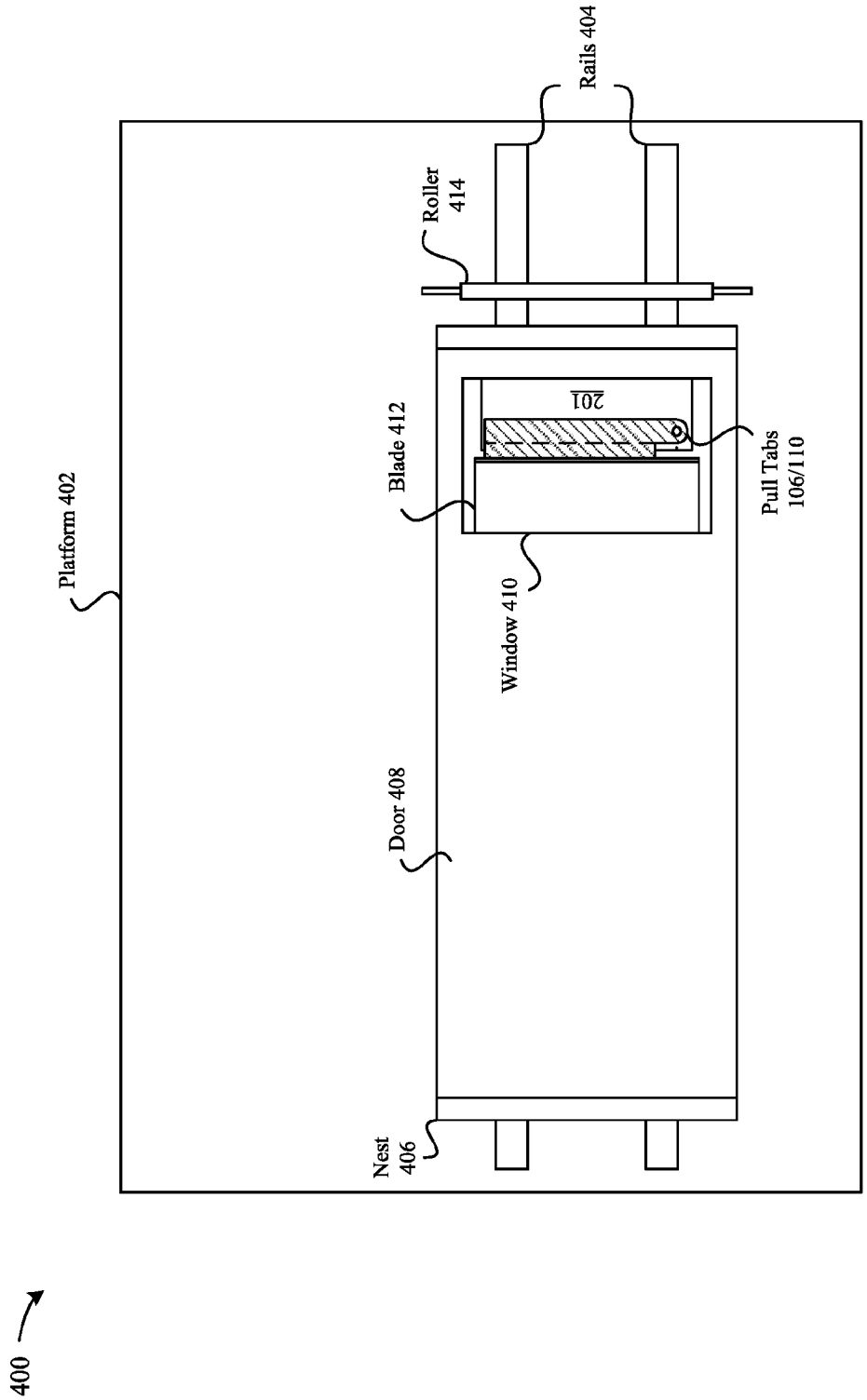
Figure 4D:
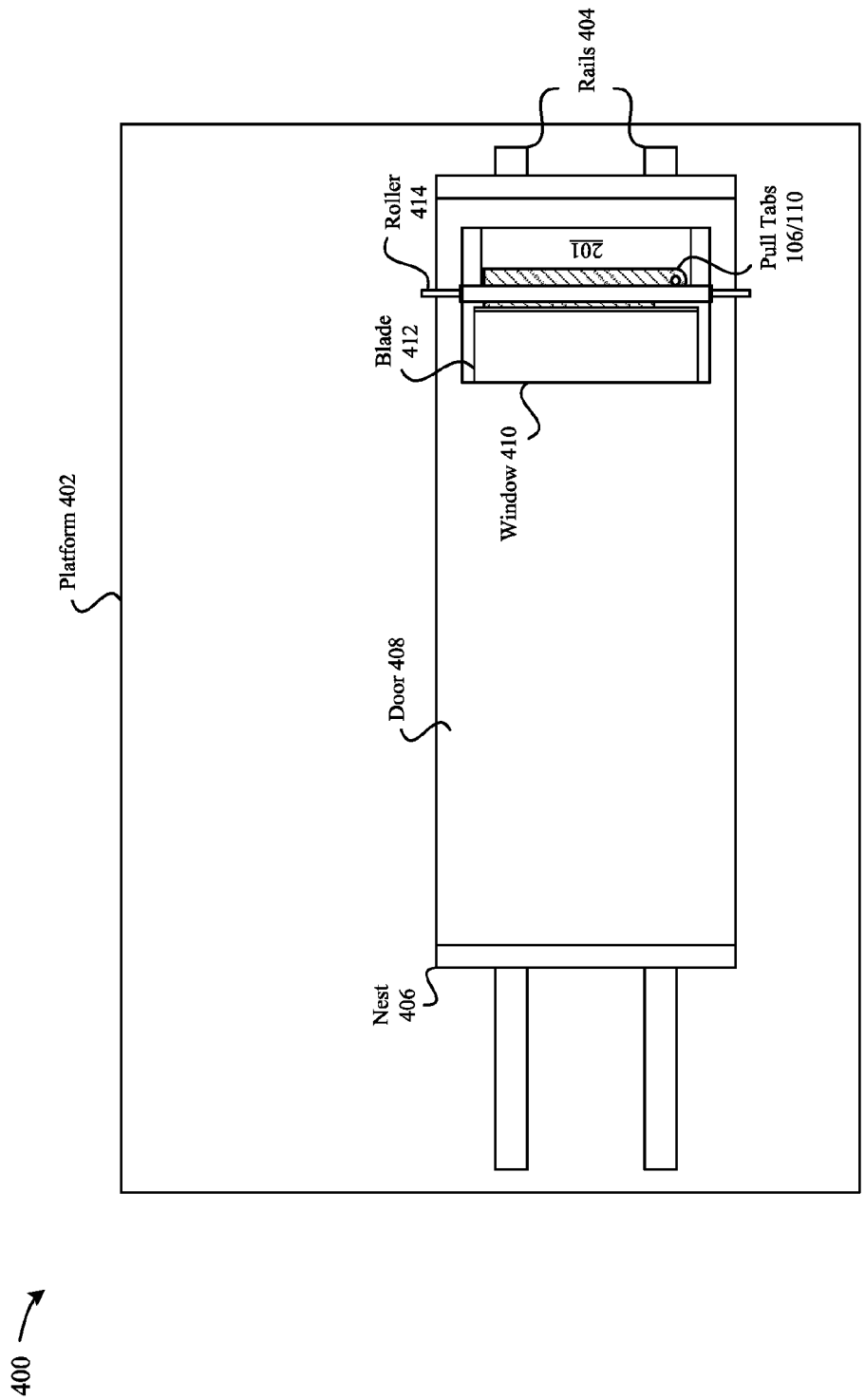
Figure 4E:
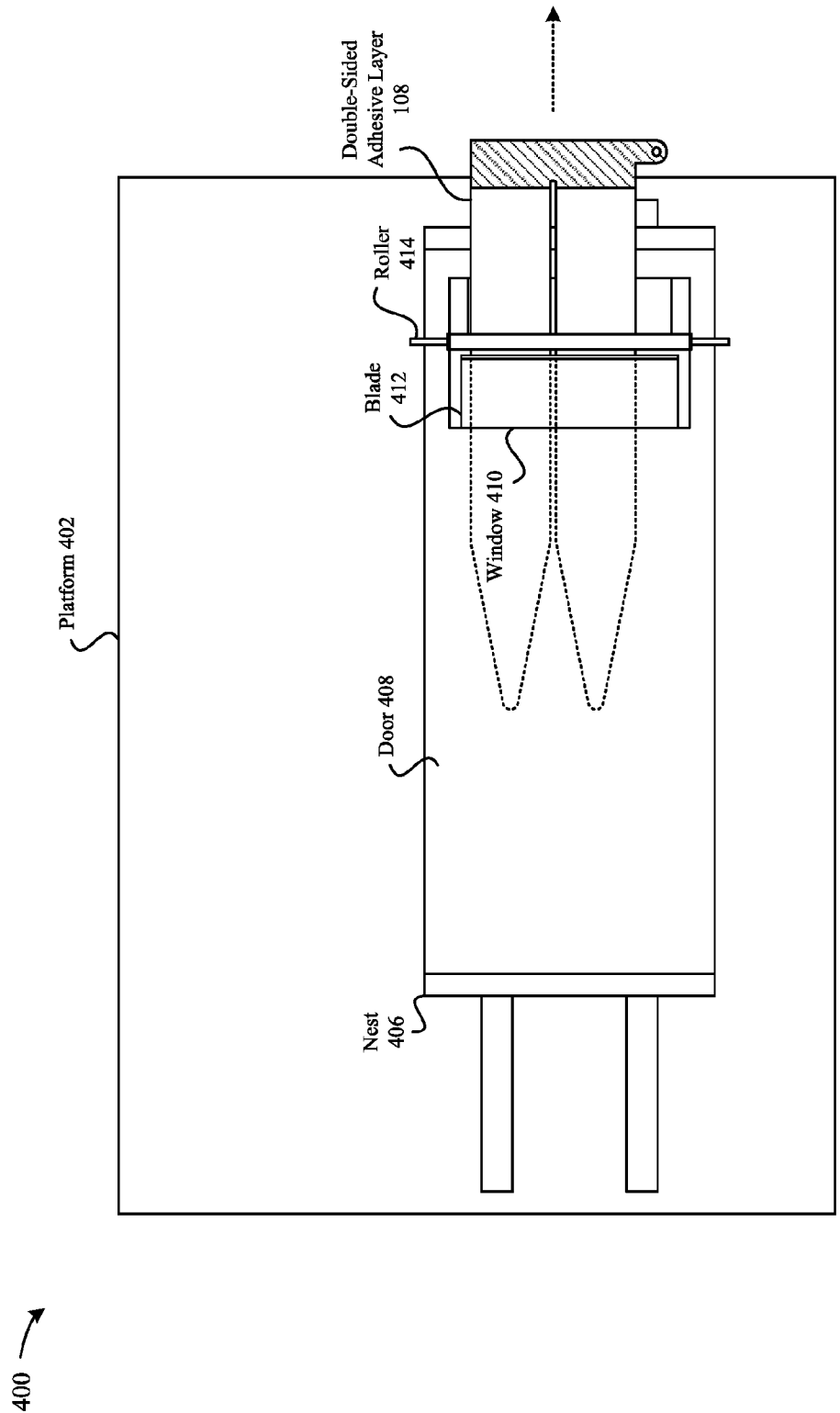

FIG. 4C shows the removal apparatus 400 with the door 408 in a closed position over the device housing 102, where the unfolded pull tabs 106/110 extend out through the window 410. Notably, the blade 412 is positioned substantially close to the internal component 114 in order to reduce the amount of friction that occurs against the internal component 114 as the double-sided adhesive layer 108 is being removed. Once the blade 412 is positioned properly and locked into place, the nest 406 can be moved along the platform 402 via the rails 404 until the roller is properly positioned over the pull tabs 106/110, as shown in FIG. 4D. The nest 406 is then locked into place along the rails 404, whereupon the pull tabs 106/110 can be grasped and pulled on (e.g., by a technician using a tool) in a direction that is substantially parallel to the bonding plane provided by the double-sided adhesive layer 108, as shown in FIG. 4E. Notably, and although not illustrated in FIGS. 4A-4E, the removal apparatus 400 can include additional components that are configured to grip the pull tabs 106/110 and to pull them at a controlled rate to remove the double-sided adhesive layer 108.

Figure 5:
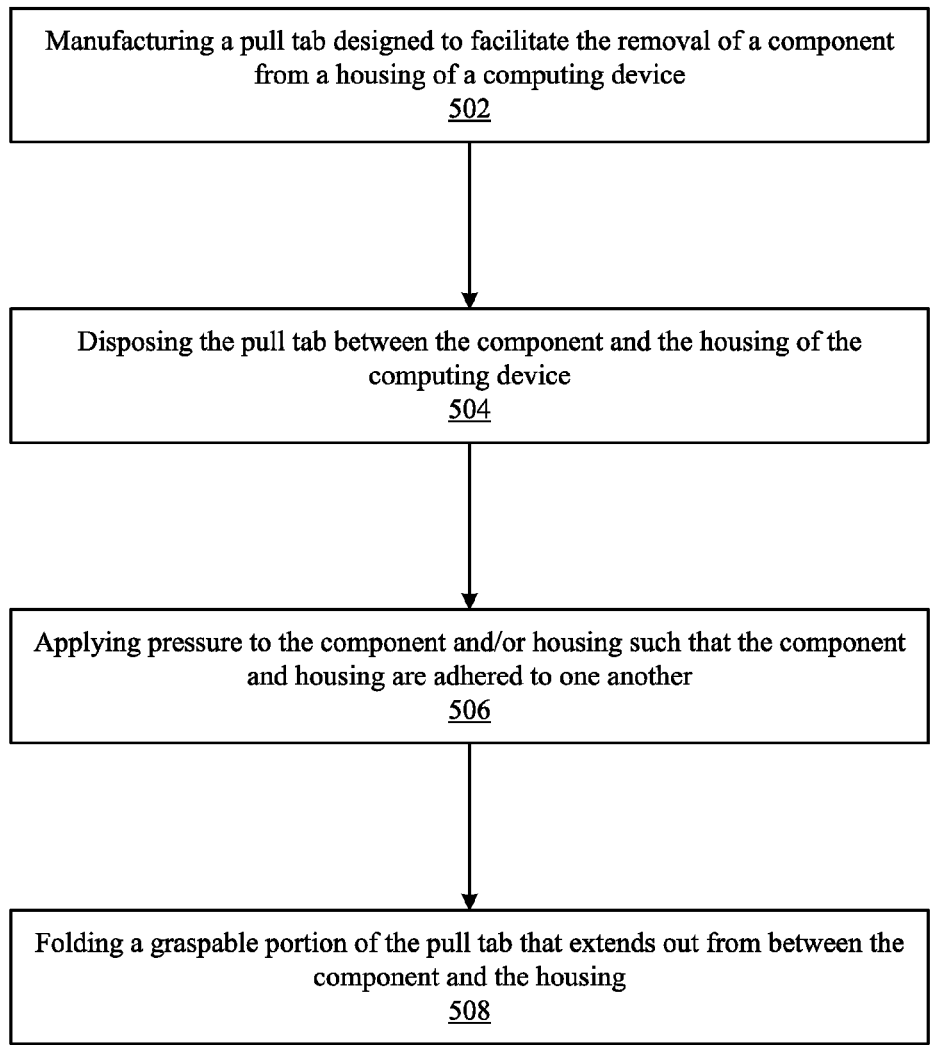
FIG. 5 illustrates a method for configuring the pull tab component removal apparatus of FIGS. 1A-1B, according to one embodiment of the invention.

FIG. 5 illustrates a method 500 for manufacturing and utilizing the pull tab component removal apparatus 101 of FIGS. 1A-1B, according to one embodiment of the invention. As shown, the method 500 begins at step 502, which involves manufacturing the pull tab component removal apparatus 101 (e.g., according to the shape illustrated in FIGS. 1A-1B). Step 504 involves disposing the pull tab (i.e., the double-sided adhesive layer 108 and the pull tab liners 106/110) between the component (e.g., the internal component 114) and the housing of the computing device (e.g., the device housing 102). Step 506 involves applying pressure to the component and/or housing such that the component and the housing are adhered to one another, e.g., as illustrated in FIGS. 3A-3B. Finally, step 508 involves folding a graspable portion of the pull tab that extends out from between the component and the housing, which, as described herein, enables the graspable portion of the pull tab to be hidden away and unfolded later on when removal of the component is required.

The various aspects, embodiments, implementations or features of the described embodiments can be used separately or in any combination. Various aspects of the described embodiments can be implemented by software, hardware or a combination of hardware and software. The described steps and embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A stretch release adhesive configured to both secure a component to an interior surface of a housing and to extract the component from the interior surface of the housing, the stretch release adhesive comprising:
    a double-sided adhesive body configured to adhere the component to the interior surface of the housing, and having a leg at a distal end of the double-sided adhesive body for placement between the component and the interior surface of the housing; and
    a graspable portion that is formed at an opposite distal end of the double-sided adhesive body relative to the leg and extends away from the double-sided adhesive body in a non-parallel direction relative to the leg.

2. The stretch release adhesive of claim 1, wherein the double-sided adhesive body includes a secondary leg that extends parallel to the leg and is separated from the leg by a gap, and a length of the gap extends in a different direction than the graspable portion.

3. The stretch release adhesive of claim 1, wherein a distance from which the graspable portion extends from the double-sided adhesive body is less than a width of the at least one leg.

4. The stretch release adhesive of claim 1, wherein the graspable portion includes a hole for providing a means to further grip the graspable portion, and an edge of graspable portion at least partially defines an edge of the opposite distal end of the double-sided adhesive body.

5. The stretch release adhesive of claim 4, further comprising:
    a pull tab liner disposed over the graspable portion, wherein the pull tab liner includes a liner hole that at least partially overlaps the hole of the graspable portion.

6. A stretch release adhesive, comprising:
    a double-sided adhesive body;
    two legs formed at a distal end of the double-sided adhesive body;
    a gap between the two legs and extending across a majority of a length of the two legs; and
    a graspable portion that is formed to the double-sided adhesive body and extends away from the double-sided adhesive body in a non-parallel direction relative to the two legs.

7. The stretch release adhesive of claim 6, wherein the graspable portion comprises a non-sticky surface that includes a hole.

8. The stretch release adhesive of claim 6, wherein an edge of graspable portion at least partially defines an edge of the distal end of the double-sided adhesive body.

9. The stretch release adhesive of claim 6, wherein the gap extends in a different direction than the graspable portion extends from the double-sided adhesive body.

10. The stretch release adhesive of claim 6, wherein a distance from which the graspable portion extends from the double-sided adhesive body is less than a width of the two legs.

11. The stretch release adhesive of claim 6, further comprising:
    a first pull tab liner disposed over the two legs of the double-sided adhesive body, and
    a second pull tab liner disposed over the graspable portion.

12. The stretch release adhesive of claim 11, wherein the second pull tab liner includes an aperture that overlaps a hole in the graspable portion.

13. The stretch release adhesive of claim 6, wherein the graspable portion comprises siliconized polyethylene terephthalate (PET).

14. A method for producing a stretch release adhesive configured to both secure a component to an interior surface of a housing and to extract the component from the interior surface of the housing, the method comprising:
    placing the stretch release adhesive between the component and the interior surface of the housing, the stretch release adhesive comprising a double-sided adhesive body having a leg, and a graspable portion formed at a distal end of the double-sided adhesive body opposite the leg and extending away from the double-sided adhesive body in a non-parallel direction relative to the leg.

15. The method of claim 14, further comprising:
    removing a liner from two sides of the double-sided adhesive body before placing the stretch release adhesive between the component and the interior surface of the housing.

16. The method of claim 14, wherein placing the stretch release adhesive between the component and the interior surface of the housing further comprises extending the double-sided adhesive body over a majority of a surface of the component.

17. The method of claim 14, wherein the pulling force is directed by a structure that is coupled to a platform on which the component is secured.

18. The method of claim 17, wherein the structure is a roller structure.

19. The method of claim 17, wherein the structure is a blade structure.

20. The method of claim 19, wherein an outer surface of the blade structure comprises a low friction material.

\* \* \* \* \*